United States Patent
Hattori et al.

(10) Patent No.: US 11,551,987 B2
(45) Date of Patent: Jan. 10, 2023

(54) POWER MODULE COMPRISING A PRIMER LAYER

(71) Applicant: SHIN-ETSU CHEMICAL CO., LTD., Tokyo (JP)

(72) Inventors: Hatsuhiko Hattori, Annaka (JP); Atsushi Horinobu, Tokyo (JP); Kensuke Kuwajima, Tokyo (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 127 days.

(21) Appl. No.: 17/042,676

(22) PCT Filed: Mar. 28, 2019

(86) PCT No.: PCT/JP2019/013507
§ 371 (c)(1),
(2) Date: Sep. 28, 2020

(87) PCT Pub. No.: WO2019/189543
PCT Pub. Date: Oct. 3, 2019

(65) Prior Publication Data
US 2021/0066147 A1    Mar. 4, 2021

(30) Foreign Application Priority Data
Mar. 29, 2018    (JP) .............................. JP2018-064941

(51) Int. Cl.
*H01L 23/29* (2006.01)
*C08G 73/10* (2006.01)
(Continued)

(52) U.S. Cl.
CPC .............. *H01L 23/29* (2013.01); *C08G 73/10* (2013.01); *C08G 77/54* (2013.01); *C08K 3/36* (2013.01);
(Continued)

(58) Field of Classification Search
CPC ...................................................... H01L 23/29
(Continued)

(56) References Cited

U.S. PATENT DOCUMENTS

| | | | |
|---|---|---|---|
| 6,183,869 B1 * | 2/2001 | Okuda ................... | B05D 5/083 428/411.1 |
| 2013/0058062 A1 * | 3/2013 | Tachibana .............. | H05K 3/387 216/13 |
| 2018/0312723 A1 | 11/2018 | Hattori et al. | |

FOREIGN PATENT DOCUMENTS

| | | |
|---|---|---|
| JP | 2006-32617 A | 2/2006 |
| JP | 2009-60146 A | 3/2009 |

(Continued)

OTHER PUBLICATIONS

International Search Report, issued in PCT/JP2019/013507, PCT/ISA/210, dated Jun. 18, 2019.
(Continued)

*Primary Examiner* — Ajay Arora
(74) *Attorney, Agent, or Firm* — Birch, Stewart, Kolasch & Birch, LLP

(57) ABSTRACT

According to the present invention, a power module that has a base to which a power semiconductor device is bonded and a sealing body for sealing said base and in which the base and the sealing body are bonded with a primer layer interposed therebetween, said primer layer being formed of a cured product of a silicone-modified polyimide resin composition containing, for example, components (A) to (E) below, has high reliability because delamination of an epoxy sealing resin under high temperature conditions is suppressed.

(A) Silicone-modified polyimide resin represented by formula (1)

$$E_e\text{-}F_f\text{-}G_g \quad (1)$$

E is represented by formula (2), F is represented by formula (3), G is a divalent group derived from diamine, f+e+g=100 mol %, the molar ratio f/(e+g) is 0.9-1.1, and e is 1-90 when the sum of e and g is 100.

(Continued)

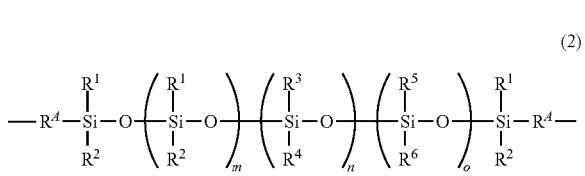

(2)

$R^A$ is a divalent hydrocarbon group, $R^1$ and $R^2$ are alkyl groups, $R^3$ and $R^4$ are monovalent aliphatic hydrocarbon groups, $R^5$ and $R^6$ are aryl groups or the like, m is an integer of 0-20, n is an integer of 1-20, o is an integer of 0-20, and m+n+o is an integer of 1-30.

-Im-X-Im-  (3)

Im is a cyclic group including a cyclic imide structure, and X is a single bond or the like.

(Bc) Heat-decomposable radical initiator
(C) Solvent
(D) Antioxidant
(E) Fumed silica.

3 Claims, 1 Drawing Sheet

(51) Int. Cl.
  *C08G 77/54*  (2006.01)
  *C08K 3/36*   (2006.01)
  *H01L 23/31*  (2006.01)
  *H01L 23/473* (2006.01)
  *H05K 7/20*   (2006.01)

(52) U.S. Cl.
  CPC ............ *H01L 23/31* (2013.01); *H01L 23/473* (2013.01); *H05K 7/2089* (2013.01)

(58) Field of Classification Search
  USPC ........................................................ 257/788
  See application file for complete search history.

(56) References Cited

FOREIGN PATENT DOCUMENTS

| | | | |
|---|---|---|---|
| JP | 2017-115050 A | | 6/2017 |
| JP | 2018046192 A | * | 3/2018 |

OTHER PUBLICATIONS

Written Opinion of the International Searching Authority, issued in PCT/JP2019/013507, PCT/ISA/237, dated Jun. 18, 2019.

* cited by examiner

POWER MODULE COMPRISING A PRIMER LAYER

TECHNICAL FIELD

This invention relates to a power module.

BACKGROUND ART

Modern power modules using SiC devices are expected to operate in a higher temperature region than before as a result of increased current flow.

In the prior art, epoxy resin encapsulants are widely used for the protection of semiconductor chips (see Patent Document 1, for example). When a semiconductor device is operated at high temperature, there arises a problem that stresses are applied around the semiconductor device because of different coefficients of linear expansion of a semiconductor chip, base member and epoxy resin encapsulant, with the increased likelihood of the encapsulant peeling off.

Since the epoxy resin is less moisture proof and its cured product has a high hardness, there arises another problem that the epoxy resin sometimes fails to bond in the encapsulation step of semiconductor chips and often peels off in subsequent steps, leading to a loss of reliability as package.

PRIOR ART DOCUMENTS

Patent Documents

Patent Document 1: JP-A 2009-060146

SUMMARY OF INVENTION

Technical Problem

An object of the invention, which has been made under the above-mentioned circumstances, is to provide a power module which is effective for preventing the encapsulating epoxy resin from delamination under high temperature conditions and thus highly reliable.

Solution to Problem

Making extensive investigations to attain the above object, the inventors have found that when a base member and an encapsulant are bonded using a primer of a specific resin composition, a power module is improved in high-temperature durability. The invention is predicated on this finding.

The invention is defined below.
1. A power module comprising a base member having a power semiconductor device joined thereto and an encapsulating body for encapsulating the base member, wherein the encapsulating body is bonded to the base member via a primer layer comprising a cured product of a silicone-modified polyimide resin composition.
2. The power module of 1 wherein said silicone-modified polyimide resin composition comprises:
(A1) 100 parts by weight of a radically crosslinking silicone-modified polyimide resin having the following formula (1):

wherein E, F and G are repeating units which are randomly arranged, E is a divalent group derived from a diamino-modified silicone, represented by the formula (2), F is a divalent group derived from a tetracarboxylic dianhydride, represented by the formula (3), and G is a divalent group derived from a diamine, with the proviso that f+e+g=100 mol %, a molar ratio of f/(e+g) is from 0.9/1 to 1.1/1, and e is 1 to 90 when the sum of e+g is 100,

[Chem. 1]

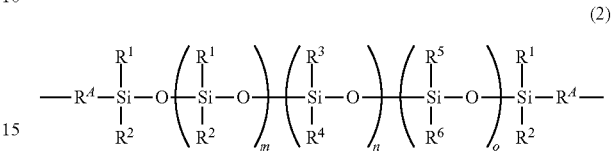

wherein $R^A$ is each independently a $C_1$-$C_{10}$ substituted or unsubstituted divalent hydrocarbon group, $R^1$ and $R^2$ are each independently a $C_1$-$C_{10}$ substituted or unsubstituted alkyl group, $R^3$ and $R^4$ are each independently a $C_1$-$C_{10}$ monovalent aliphatic hydrocarbon group, at least one of $R^3$ and $R^4$ has an aliphatic unsaturated bond, $R^5$ and $R^6$ are each independently a substituted or unsubstituted $C_1$-$C_{10}$ alkyl group, $C_6$-$C_{10}$ aryl group or $C_7$-$C_{16}$ aralkyl group, m is an integer of 0 to 20, n is an integer of 1 to 20, o is an integer of 0 to 20, the sum of m+n+o is 1 to 30, and the arrangement of siloxane units in parentheses with subscripts m, n, and o may be random, alternate or blockwise,

wherein Im is a cyclic group terminated with a cyclic imide structure, and X is a single bond or a divalent group selected from among —O—, —S—, —S(→O)—, —S(=O)$_2$—, —C(=O)—, —NR$^N$— wherein R$^N$ is a $C_1$-$C_{12}$ monovalent hydrocarbon group, —CR$^B{}_2$— wherein R$^B$ is each independently hydrogen or a $C_1$-$C_{12}$ monovalent hydrocarbon group which may contain halogen, —R$^{Ar}{}_h$— wherein R$^{Ar}$ is a $C_6$-$C_{12}$ divalent arylene group, h is an integer of 1 to 6, and R$^{Ar}$ may be the same or different when h is at least 2, —R$^{Ar}{}_h$—(OR$^{Ar}$)$_i$— wherein R$^{Ar}$ and h are as defined above and i is an integer of 1 to 5, $C_1$-$C_{12}$ straight or branched alkylene groups, $C_5$-$C_{12}$ cycloalkylene groups, and $C_7$-$C_{12}$ arylenealkylene groups, (Bc) 0.1 to 10 parts by weight of a heat decomposable radical initiator,
(C) 100 to 700 parts by weight of a solvent,
(D) 0.01 to 1 part by weight of an antioxidant, and
(E) 3 to 50 parts by weight of hydrophobic fumed silica.
3. The power module of 1 wherein said silicone-modified polyimide resin composition comprises:
(A2) 100 parts by weight of an epoxy curable silicone-modified polyimide resin having the following formula (1'):

wherein E', F' and G' are repeating units which are randomly arranged, E' is a divalent group derived from a diamino-modified silicone, represented by the formula (2'), F' is a divalent group derived from a tetracarboxylic dianhydride, represented by the formula (3), G' is a divalent group derived from a diamine, and at least some of G' contain a divalent group derived from a hydroxyl-containing aromatic diamine, with the proviso that f'+e'+g'=100 mol %, a molar ratio of f'/(e'+g') is from 0.9/1 to 1.1/1, and e' is 1 to 90 when the sum of e'+g' is 100,

[Chem. 2]

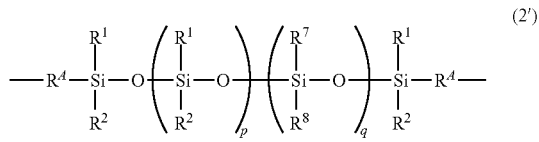

(2')

wherein $R^A$ is each independently a $C_1$-$C_{10}$ substituted or unsubstituted divalent hydrocarbon group, $R^1$ and $R^2$ are each independently a $C_1$-$C_{10}$ substituted or unsubstituted alkyl group, $R^7$ and $R^8$ are each independently a substituted or unsubstituted $C_6$-$C_{10}$ aryl group or $C_7$-$C_{16}$ aralkyl group, p is an integer of 1 to 20, q is an integer of 0 to 20, the sum of p+q is 1 to 30, and the arrangement of siloxane units in parentheses with subscripts p and q may be random, alternate or blockwise, -Im-X-Im- (3)

wherein Im is a cyclic group terminated with a cyclic imide structure, and X is a single bond or a divalent group selected from among —O—, —S—, —S(→O)—, —S(=O)$_2$—, —C(=O)—, —NR$^N$— wherein R$^N$ is a $C_1$-$C_{12}$ monovalent hydrocarbon group, —CR$^B{}_2$— wherein R$^B$ is each independently hydrogen or a $C_1$-$C_{12}$ monovalent hydrocarbon group which may contain halogen, —R$^{Ar}{}_h$— wherein R$^{Ar}$ is a $C_6$-$C_{12}$ divalent arylene group, h is an integer of 1 to 6, and R$^{Ar}$ may be the same or different when h is at least 2, —R$^{Ar}{}_h$—(OR$^{Ar}$)$_i$— wherein R$^{Ar}$ and h are as defined above and i is an integer of 1 to 5, $C_1$-$C_{12}$ straight or branched alkylene groups, $C_5$-$C_{12}$ cycloalkylene groups, and $C_7$-$C_{12}$ arylenealkylene groups, (Be) 0.1 to 10 parts by weight of an epoxy resin crosslinker, (C) 250 to 1,200 parts by weight of a solvent, (D) 0.01 to 1 part by weight of an antioxidant, and (E) 3 to 50 parts by weight of hydrophobic fumed silica.

4. The power module of 2 or 3 wherein Im is selected from the following groups:

[Chem. 3]

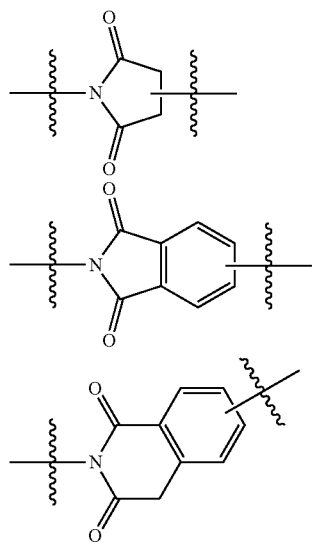

wherein the line with an intersecting wavy line designates a valence bond and the valence bond of the nitrogen atom attaches to E or G in formula (2) or to E' or G' in formula (2') and the other valence bond attaches to X.

Advantageous Effects of Invention

Since a base member and an encapsulating body are bonded using a primer in the form of a composition comprising a silicone-modified polyimide resin, the power module of the invention is effective for preventing delamination between a semiconductor device and an epoxy resin encapsulant having different coefficients of linear expansion. The power module can be operated at high temperatures of 175° C. or above.

DESCRIPTION OF EMBODIMENTS

Figure 1:
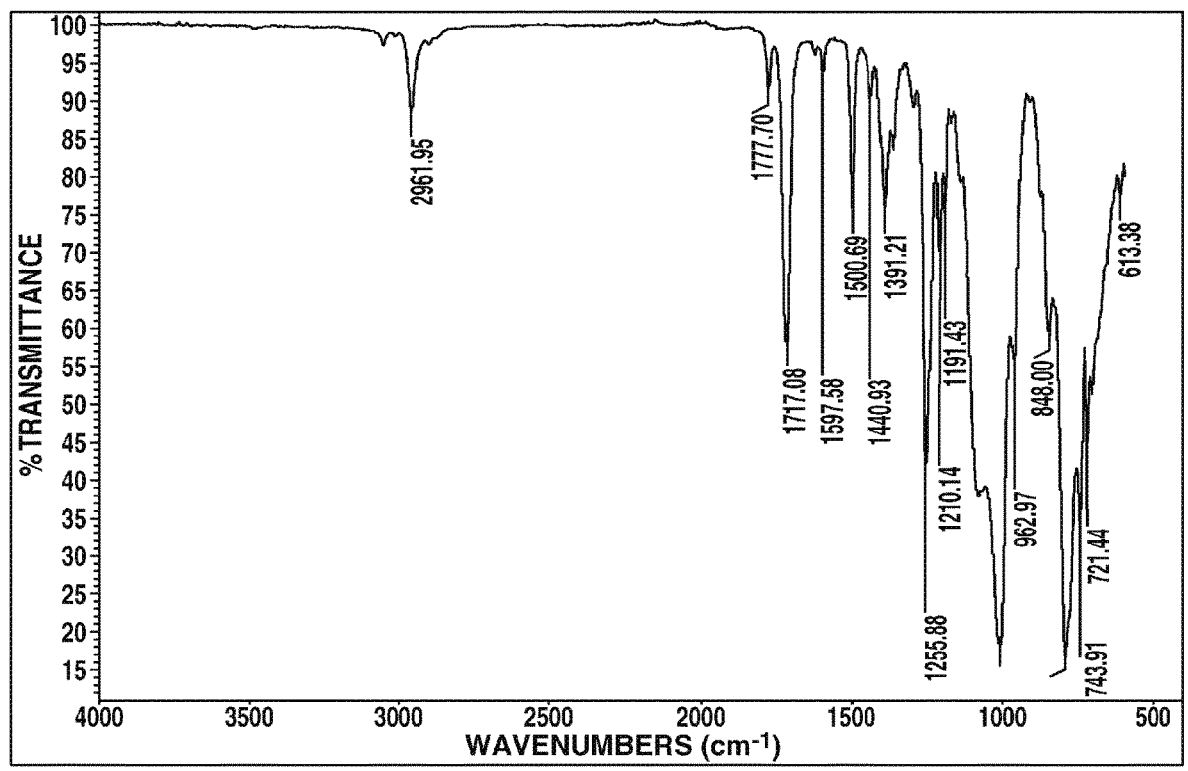
FIG. 1 is a diagram of the infrared absorption spectrum of the silicone-modified polyimide resin obtained in Synthesis Example 1.

Now the invention is described in detail.

The invention provides a power module comprising a base member having a power semiconductor device joined thereto and an encapsulating body for encapsulating the base member, wherein the encapsulating body is bonded to the base member via a primer layer comprising a cured product of a silicone-modified polyimide resin composition.

Examples of the power semiconductor device include semiconductor devices or power semiconductor chips such as IGBTs (insulated-gate bipolar transistors), diodes, Si MOSFETs (metal-oxide-semiconductor field effect transistors), SiC MOSFETs, and GaN FETs (gallium nitride field effect transistors).

Examples of the base member include copper substrates and metal frames obtained by applying electroconductive plating such as gold plating, silver plating, nickel plating, nickel-palladium-gold plating, tin plating or zinc plating to copper substrates.

The resin used as the encapsulating body is preferably selected from epoxy resins, for example, phenol aralkyl type epoxy resins, cresol-novolak type epoxy resins, bisphenol A type epoxy resins, bisphenol F type epoxy resins, triphenol alkane type epoxy resins, biphenyl type epoxy resins, phenol aralkyl type epoxy resins, dicyclopentadiene type epoxy resins, fluorene skeleton-containing epoxy resins, biphenyl aralkyl type epoxy resins, naphthalene aralkyl type epoxy resins, silicone-modified epoxy resins, and butadiene-modified epoxy resins.

The silicone-modified polyimide resin composition used herein to form the primer layer should preferably comprise the following components (A) to (E):

(A) a silicone-modified polyimide resin,
(B) a crosslinker or curing agent,
(C) a solvent,
(D) an antioxidant, and
(E) hydrophobic fumed silica because such composition has good adhesion to silicone rubber.

(1) Component (A)

The silicone-modified polyimide resin or component (A) serves as the main component or base polymer in the composition and is divided into (A1) a radically crosslinking silicone-modified polyimide resin and (A2) an epoxy crosslinking silicone-modified polyimide resin.

The radically crosslinking silicone-modified polyimide resin (A1) used herein is preferably a resin having the following formula (1).

$$Ee\text{-}Ff\text{-}Gg \qquad (1)$$

In formula (1), E, F and G are repeating units which are randomly arranged (exclusive of combinations of adjoining units represented by E-E, F-F, G-G, and E-G), E is a divalent group derived from a diamino-modified silicone, represented by the following formula (2), F is a divalent group derived from a tetracarboxylic dianhydride, represented by the following formula (3), and G is a divalent group derived from a diamine, with the proviso that f+e+g=100 mol %, a molar ratio of f/(e+g) is from 0.9/1 to 1.1/1, and e is 1 to 90 when the sum of e+g is 100.

[Chem. 4]

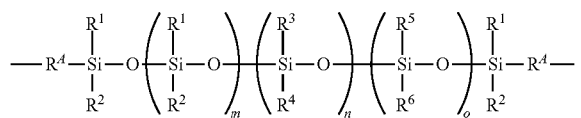

$$(2)$$

In formula (2), $R^4$ is each independently a $C_1$-$C_{10}$ substituted or unsubstituted divalent hydrocarbon group, $R^1$ and $R^2$ are each independently a $C_1$-$C_{10}$ substituted or unsubstituted alkyl group, $R^3$ and $R^4$ are each independently a $C_1$-$C_{10}$ monovalent aliphatic hydrocarbon group, at least one of $R^3$ and $R^4$ has an aliphatic unsaturated bond, $R^5$ and $R^6$ are each independently a substituted or unsubstituted $C_1$-$C_{10}$ alkyl group, $C_6$-$C_{10}$ aryl group or $C_7$-$C_{16}$ aralkyl group, m is an integer of 0 to 20, n is an integer of 1 to 20, o is an integer of 0 to 20, and the sum of m+n+o is 1 to 30. The arrangement of siloxane units in parentheses with subscripts m, n, and o may be random, alternate or blockwise.

$$\text{-Im-X-Im-} \qquad (3)$$

In formula (3), Im is a cyclic group terminated with a cyclic imide structure. X is a single bond or a divalent group selected from among —O—, —S—, —S(→O)—, —S(=O)$_2$—, —C(=O)—, —NR$^N$— wherein R$^N$ is a $C_1$-$C_{12}$ monovalent hydrocarbon group, —CR$^B$$_2$— wherein R$^B$ is each independently hydrogen or a $C_1$-$C_{12}$ monovalent hydrocarbon group which may contain halogen, —R$^{Ar}_h$— wherein R$^{Ar}$ is a $C_6$-$C_{12}$ divalent arylene group, h is an integer of 1 to 6, and R$^{Ar}$ may be the same or different when h is at least 2, —R$^{Ar}_h$—(OR$^{Ar}$)$_i$— wherein R$^{Ar}$ and h are as defined above and i is an integer of 1 to 5, $C_1$-$C_{12}$ straight or branched alkylene groups, $C_5$-$C_{12}$ cycloalkylene groups, and $C_7$-$C_{12}$ arylenealkylene groups.

In formula (2), the $C_1$-$C_{10}$, preferably $C_3$-$C_8$ divalent hydrocarbon group $R^4$ may be straight, branched or cyclic and contain a heteroatom such as oxygen or nitrogen. Examples include alkylene, arylene, aralkylene, and arylenealkylene groups, with the alkylene groups being preferred. Preferred examples include methylene, ethylene, trimethylene, 1,3-butylene, tetramethylene, 1,3-pentylene, 1,4-pentylene, pentamethylene, hexamethylene, heptamethylene, octamethylene, nonamethylene, decamethylene, 2-(3-prop-1-oxy)eth-1-ylene, 3-(3-prop-1-oxy)prop-1-ylene, 4-(3-prop-1-oxy)but-1-ylene, 5-(3-prop-1-oxy)pent-1-ylene, 6-(3-prop-1-oxy)hex-1-ylene, 1,3-cyclohexylene, 1,4-cyclohexylene, 1,3-cycloheptylene, 1,4-cycloheptylene, N,N-piperidinylene, and 1,4-dioxacyclohex-2,5-ylene. For availability, trimethylene is more preferred.

The $C_1$-$C_{10}$ alkyl groups $R^1$ and $R^2$ may be straight, branched or cyclic, and examples thereof include methyl, ethyl, n-propyl, isopropyl, n-butyl, isobutyl, tert-butyl, n-pentyl, neopentyl, n-hexyl, cyclohexyl, n-heptyl, n-octyl, n-nonyl, n-decyl, and decalyl. Of these, $C_1$-$C_4$ alkyl groups are preferred, with methyl, ethyl, and n-propyl being more preferred. It is even more preferred that both $R^1$ and $R^2$ be methyl or ethyl.

In the alkyl groups, some or all of the hydrogen atoms may be substituted by halogen atoms such as fluorine, chlorine, bromine, and iodine.

The $C_1$-$C_{10}$ monovalent aliphatic hydrocarbon groups $R^3$ and $R^4$ may be straight, branched or cyclic, and examples thereof include $C_1$-$C_{10}$ alkyl groups such as methyl, ethyl, n-propyl, isopropyl, n-butyl, isobutyl, tert-butyl, n-pentyl, neopentyl, n-hexyl, cyclohexyl, n-heptyl, n-octyl, n-nonyl, n-decyl, and decalyl; and $C_2$-$C_{10}$ alkenyl groups such as vinyl, 1-propenyl, allyl (or 2-propenyl), isopropenyl, hexenyl, octenyl, cyclopentenyl, and cyclohexenyl. Of these, $R^3$ and $R^4$ are preferably selected from $C_1$-$C_6$ monovalent aliphatic hydrocarbon groups, more preferably $C_1$-$C_6$ alkyl groups and $C_2$-$C_6$ alkenyl groups, with methyl, ethyl, n-propyl, and vinyl being even more preferred.

It is especially preferred that $R^3$ and/or $R^4$ be a $C_2$-$C_6$ alkenyl group. Therefore, suitable combinations of $R^3$ with $R^4$ are methyl with vinyl, ethyl with vinyl, propyl with vinyl, and vinyl with vinyl.

The $C_1$-$C_{10}$ alkyl groups $R^5$ and $R^6$ are as exemplified above for $R^1$. Likewise, $R^5$ and $R^6$ are preferably selected from $C_1$-$C_4$ alkyl groups, more preferably methyl, ethyl, and n-propyl, with methyl and ethyl being even more preferred.

In the $C_6$-$C_{10}$ aryl groups, some or all of the hydrogen atoms may be substituted by $C_1$-$C_{10}$ alkyl groups as mentioned above, and the aromatic ring may contain a heteroatom.

Examples include phenyl, 2-methylphenyl, 3-methylphenyl, 4-methylphenyl, 2,3-dimethylphenyl, 2,4-dimethylphenyl, 2,6-dimethylphenyl, 3,4-dimethylphenyl, 3,5-dimethylphenyl, 2,3,4-trimethylphenyl, 2,3,5-trimethylphenyl, 2,4,6-trimethylphenyl, and indenyl.

Also, in the $C_7$-$C_{16}$ aralkyl groups, some or all of the hydrogen atoms may be substituted by $C_1$-$C_{10}$ alkyl groups as mentioned above, and the aromatic ring may contain a heteroatom.

Examples include phenylmethyl, 2-phenyl-1-ethyl, 3-phenyl-1-propyl, phenylbutyl, 3-phenyl-1-pentyl, 4-phenyl-1-pentyl, 5-phenyl-1-pentyl, 6-phenyl-1-hexyl, 7-phenyl-1-heptyl, 8-phenyl-1-octylene, 9-phenyl-1-nonyl, 10-phenyl-1-decyl, and 2,3-dihydro-1H-indenyl.

Of these, $R^3$ and $R^4$ are preferably methyl, phenyl, 2-phenyl-1-ethyl, 2-phenyl-2-methyl-1-ethyl, and 3-phenyl-2-propyl.

Especially, suitable combinations of $R^3$ with $R^4$ are methyl with phenyl, methyl with 2-phenyl-1-ethyl, methyl with 2-phenyl-2-methyl-1-ethyl, and phenyl with phenyl.

In formula (2), m is an integer of 0 to 20, n is an integer of 1 to 20, o is an integer of 0 to 20, and the sum of m+n+o is 1 to 60. Preferably m is an integer of 4 to 15, n is preferably an integer of 4 to 10, o is preferably an integer of 0 to 5, n+o is preferably 1 to 40, more preferably 1 to 10, and m+n+o is preferably 5 to 40.

Examples of the group having formula (2) are given below, but not limited thereto.

[Chem. 5]

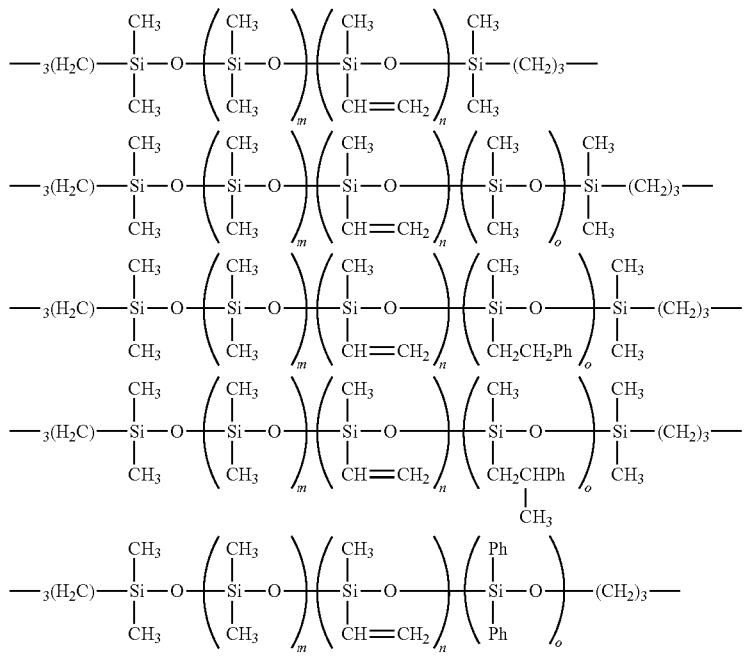

Herein Ph is phenyl, m, n, and o are as defined above. The arrangement of siloxane units in parentheses may be random, alternate or blockwise.

In formula (3), Im having a cyclic imide structure derived from a tetracarboxylic dianhydride is a group terminated with a cyclic imide structure, which is selected from, for example, groups of the following formulae.

[Chem. 6]

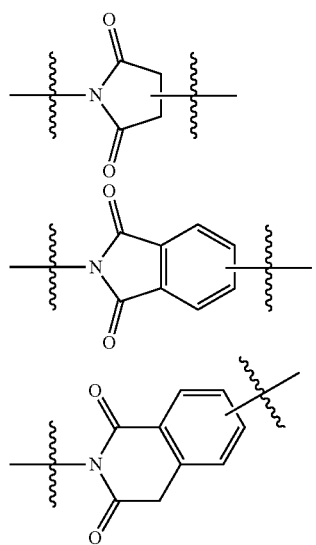

Herein the line with an intersecting wavy line represents a valence bond (the same holds true, hereinafter). The valence bond from a ring-member carbon atom different from the valence bond from the nitrogen atom is to attach to X.

In formula (3), when X is $-NR^N-$, the $C_1$-$C_{12}$, preferably $C_1$-$C_8$ monovalent hydrocarbon group $R^N$ may be straight, branched or cyclic, and examples thereof include $C_1$-$C_{12}$ alkyl groups such as methyl, ethyl, n-propyl, isopropyl, n-butyl, isobutyl, tert-butyl, n-pentyl, neopentyl, n-hexyl, cyclohexyl, n-heptyl, n-octyl, n-nonyl, n-decyl, and decalyl; $C_2$-$C_{12}$ alkenyl groups such as vinyl, 1-propenyl, allyl (or 2-propenyl), hexenyl, octenyl, cyclopentenyl, and cyclohexenyl; $C_6$-$C_{12}$ aryl groups such as phenyl and naphthyl; $C_7$-$C_{12}$ alkylaryl groups such as tolyl, xylyl, ethylphenyl, propylphenyl, butylphenyl, pentylphenyl, and hexylphenyl; and $C_7$-$C_{12}$ aralkyl groups such as benzyl and phenethyl. Especially preferred are $C_1$-$C_8$ straight alkyl groups such as methyl, ethyl, n-propyl, n-butyl, n-pentyl, n-hexyl, n-heptyl, and n-octyl, and substituted forms of these groups in which some or all of the hydrogen atoms are substituted by fluorine, such as trifluoromethyl and 3,3,3-trifluoropropyl. More preferred are methyl and trifluoromethyl.

When X is $-CR^B{}_2-$, the $C_1$-$C_{12}$ monovalent hydrocarbon group $R^B$ which may contain halogen may be any of monovalent hydrocarbon groups as exemplified above for $R^N$. Suitable halogen atoms include fluorine, chlorine, bromine, and iodine. Inter alia, preference is given to optionally fluorine-substituted alkyl groups such as methyl, ethyl, n-propyl, trifluoromethyl, 3,3,3-trifluoropropyl, and cyclohexyl; optionally fluorine-substituted aryl groups such as phenyl, naphthyl, and perfluorophenyl; and optionally fluorine-substituted aralkyl groups such as phenylethyl and pentafluorophenylethyl.

More preferably, $R^B$ is hydrogen, methyl, trifluoromethyl or phenyl.

When X is $-R^{Ar}{}_h-$, examples of the $C_6$-$C_1$ divalent arylene group $R^{Ar}$ include phenylene, biphenylene, and naphthylene. In the arylene group $R^{Ar}$, some hydrogen atoms may be substituted by hydroxyl, sulfide, 2,3-oxo-1-propyl, methoxy, ethoxy, t-butoxy, methyl, ethyl, propyl, t-butyl, N,N-dimethylamino, cyano, methoxycarbonyl, ethoxycarbonyl, formyl, methylcarbonyl, ethylcarbonyl groups or fluorine atoms.

The subscript h is an integer of 1 to 6.
Preferred examples of $R^{Ar}$ include the following groups.

[Chem. 7]

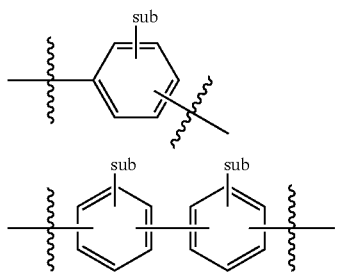

Herein "sub" is hydrogen or a substituent selected from hydroxyl, sulfide, 2,3-oxo-1-propyl, methoxy, ethoxy, t-butoxy, methyl, ethyl, propyl, t-butyl, N,N-dimethylamino, cyano, methoxycarbonyl, ethoxycarbonyl, formyl, methylcarbonyl, ethylcarbonyl, and fluorine. The number of substituents ranges from 1 to 4.

When X is $—R^{Ar}{}_h—(OR^{Ar})_i—$, $R^{Ar}$ and h are as defined above and i is an integer of 1 to 5.

Examples of $—R^{Ar}{}_h—(OR^{Ar})_i—$ include groups of the following formulae. In the formulae, —O— may be bonded at any position and the number of bonds ranges from 1 to 4.

[Chem. 8]

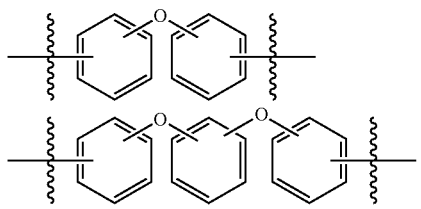

When X is a $C_1$-$C_{12}$ straight or branched alkylene group or $C_5$-$C_{12}$ cycloalkylene group, examples of these groups include methylene, ethylene, trimethylene, 1,3-butylene, tetramethylene, 1,3-pentylene, 1,4-pentylene, pentamethylene, hexamethylene, heptamethylene, octamethylene, nonamethylene, decamethylene, 1,3-cyclohexylene, 1,4-cyclohexylene, 1,3-cycloheptylene, and 1,4-cycloheptylene.

Exemplary of the $C_7$-$C_{12}$ arylenealkylene group represented by X is 2-(4-(2-eth-1-ylene)-1-phenylene)eth-1-ylene.

In formula (1), G is a divalent group derived from a diamine, which is preferably a divalent group derived from a diamine having more heat resistance, but not particularly limited.

Examples of the diamine from which such a divalent group is derived include aliphatic diamines such as tetramethylenediamine, 1,4-diaminocyclohexane, and 4,4'-diaminodicyclohexylmethane, and aromatic diamines such as o-phenylenediamine, m-phenylenediamine, p-phenylenediamine, 4,4'-diaminodiphenyl ether, 2,2-bis(4-aminophenyl)propane, and 2,2-bis[4-(4-aminophenoxy)phenyl]propane, which may be used alone or in a combination of two or more.

The silicone-modified polyimide resin having formula (1) is preferably end-capped with an acid anhydride.

The molar sum of f+e+g is 100 mol % and a molar ratio of f/(e+g) is from 0.9/1 to 1.1/1. For maintaining an adequate molecular weight, the molar ratio of f/(e+g) is preferably from 0.95 to 1.05, more preferably from 0.98 to 1.02.

Provided that the sum of e and g is 100, e is 1 to 90, preferably 20 to 50 in consideration of moisture proofness.

Now referring to the epoxy curable silicone-modified polyimide resin (A2), a resin having the following formula (1') is preferably used.

$$E'e'\text{-}F'f'\text{-}G'g' \qquad (1')$$

In formula (1'), E', F' and G' are repeating units which are randomly arranged, E' is a divalent group derived from a diamino-modified silicone, represented by the following formula (2'), F' is a divalent group derived from a tetracarboxylic dianhydride, represented by the following formula (3), G' is a divalent group derived from a diamine, and at least some of G' contain a divalent group derived from a hydroxyl-containing aromatic diamine, with the proviso that f'+e'+g'=100 mol %, a molar ratio of f'/(e'+g') is from 0.9/1 to 1.1/1, and e' is 1 to 90 when the sum of e'+g' is 100.

[Chem. 9]

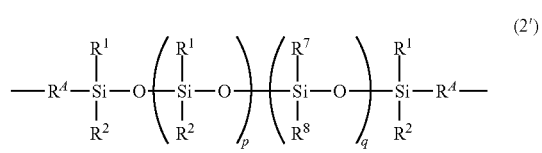

In formula (2'), $R^A$, $R^1$, and $R^2$ are as defined above for formula (2), illustrative examples and preferred examples of which are as exemplified above for formula (2). $R^7$ and $R^8$ are each independently a substituted or unsubstituted $C_6$-$C_{10}$ aryl group or $C_7$-$C_{16}$ aralkyl group, p is an integer of 1 to 20, q is an integer of 0 to 20, the sum of p+q is 1 to 30. The arrangement of siloxane units in parentheses with subscripts p and q may be random, alternate or blockwise.

$$\text{-Im-X-Im-} \qquad (3)$$

In formula (3), Im and X are as defined above, illustrative examples and preferred examples of which are as exemplified above.

Examples of the $C_6$-$C_{10}$ aryl group and $C_7$-$C_{16}$ aralkyl group represented by $R^7$ and $R^8$ include groups as exemplified above for $R^5$ and $R^6$. Phenyl, 2-phenyl-1-ethyl, and 3-phenyl-2-propyl are preferred. $R^7$ and $R^8$ are desirably identical groups.

Examples of the group having formula (2') are given below, but not limited thereto.

[Chem. 10]

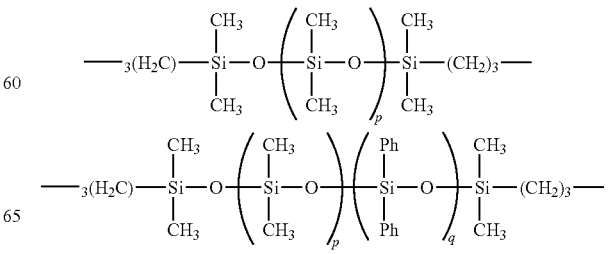

-continued

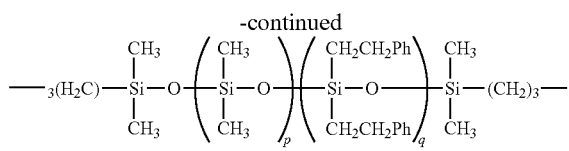

Herein Ph is phenyl, p and q are as defined above. The arrangement of siloxane units in parentheses may be random, alternate or blockwise.

In formula (1'), G' is a divalent group derived from a diamine, which is preferably a divalent group derived from a diamine having more heat resistance, but not particularly limited.

At least some of the divalent groups derived from a diamine, represented by G' in formula (1'), include a residue derived from a hydroxyl-containing aromatic diamine.

Examples of the hydroxyl-containing aromatic diamine include 2,2-bis(3-amino-4-hydroxyphenyl)hexafluoropropane, 2,2-bis(3-amino-4-hydroxyphenyl)propane, 3,3-dihydroxybenzidine, and bis(3-amino-4-hydroxyphenyl)sulfone, which may be used alone or in a combination of two or more.

Also, hydroxyl-free diamines may be used in combination, examples of which are as exemplified above for G.

Although the weight average molecular weight (Mw) of the silicone-modified polyimide resin (A1) or (A2) is not particularly limited, the Mw is preferably 10,000 to 100,000, more preferably 15,000 to 70,000 from the aspects of increasing the strength of the film obtained from a composition comprising the resin and enhancing the compatibility with other components such as a heat decomposable radical initiator and the solubility in solvents.

As used herein, the Mw is measured by gel permeation chromatography (sometimes abbreviated as GPC) versus polystyrene standards (the same holds true, hereinafter).

The silicone-modified polyimide resins (A1) and (A2) may be prepared by any well-known methods.

For example, a polyamic acid which is a precursor of the polyimide resin is first prepared by adding a tetracarboxylic dianhydride, a diamine, and a diamino-modified silicone which is a compound of the formula (2) or (2') having an amino group bonded at each end to a solvent and reacting them at low temperature, i.e., about 20° C. to about 50° C. The polyamic acid solution is then heated at a temperature of preferably 80 to 200° C., more preferably 140 to 180° C. for dehydration ring-closing reaction of the acid amide of polyamic acid, yielding a silicone-modified polyimide resin solution. The solution is then admitted into a solvent such as water, methanol, ethanol or acetonitrile for precipitation. The precipitate is dried, obtaining the silicone-modified polyimide resin.

The ratio f/(e+g) is a ratio (molar ratio) of the total moles of diamine and diamino-modified silicone to moles of tetracarboxylic dianhydride, as computed from the amounts of the reactants. In the reaction, [tetracarboxylic dianhydride (mole)]/[diamine+diamino-modified silicone (mole)] is typically controlled in a range of from 0.9/1 to 1.1/1, preferably from 0.95/1 to 1.05/1, and more preferably from 0.98/1 to 1.02/1.

Examples of the solvent used for preparation of the silicone-modified polyimide resins (A1) and (A2) include N-methyl-2-pyrrolidone, cyclohexanone, γ-butyrolactone, and N,N-dimethylacetamide. Along with this solvent, an aromatic hydrocarbon solvent such as toluene or xylene may be used to facilitate azeotropic removal of the water formed during imidization. The solvents may be used alone or in a combination of two or more.

Notably, a monofunctional reactant may be added for the purpose of adjusting the molecular weight of the silicone-modified polyimide resin, the monofunctional reactant being selected from acid anhydrides such as phthalic anhydride, maleic anhydride, hexahydro-1,3-isobenzofurandione, succinic anhydride, glutaric anhydride, and acid anhydride-modified silicones of 10 to 60 silicon atoms, and amine compounds, for example, aniline, benzylamine, straight, branched, or cyclic alkylamines of 3 to 6 carbon atoms such as propylamine, butylamine, pentylamine, hexylamine and cyclohexylamine.

Also, an aldehyde compound, typically $C_2$-$C_6$ alkyl-containing aldehyde compound such as benzaldehyde, phenylacetaldehyde, propionaldehyde or butyraldehyde may be added.

When added, the compound is preferably used in an amount of 1 to 10 mol % based on the acid anhydride in the charge, in accordance with the desired molecular weight.

The imidization step may also be performed by adding a dehydrating agent and an imidizing catalyst and optionally heating at about 50° C.

Examples of the dehydrating agent include acid anhydrides such as acetic anhydride, propionic anhydride, pivalic anhydride, trifluoroacetic anhydride, and benzoic anhydride. The dehydrating agent is preferably used in an amount of 1 to 10 moles per mole of the diamine.

Examples of the imidizing catalyst include tertiary amines such as triethylamine ($Et_3N$), diisopropylethylamine (DIPEA), tri-n-butylamine, tri-n-pentylamine, tri-n-hexylamine, tri-n-heptylamine, tri-n-octylamine, N-methylpyrrolidine, N-methylpiperazine, N-methylmorpholine, N,N,N',N'-tetramethylethylenediamine (TMEDA), N-methylimidazole (NMI), pyridine, 2,6-lutidine, 1,3,5-collidine, N,N-dimethylaminopyridine, pyrazine, quinoline, 1,8-diazabicyclo[5.4.0]-7-undecene (DBU), and 1,4-diazabicyclo[2.2.2]octane (DABCO). The imidizing catalyst is preferably used in an amount of 0.5 to 10 moles per mole of the dehydrating agent used.

This imidizing procedure is advantageous in that the resulting resin is unlikely to discolor because the reaction solution is not exposed to high temperature during the process.

Even when at least one of the diamine and the tetracarboxylic dianhydride is used as a mixture of two or more species, the reaction process is not particularly limited. For example, the reaction process may involve the steps of premixing all reactants and effecting copolycondensation or the step of adding two or more diamines or tetracarboxylic dianhydrides one by one after individual reaction.

(2) Component (B)

The inventive composition uses a heat decomposable radical initiator (Bc) as component (B) for the radically crosslinking silicone-modified polyimide resin (A1), and an epoxy resin crosslinker (Be) as component (B) for the epoxy crosslinking silicone-modified polyimide resin (A2).

The heat decomposable radical initiator (Bc) is not particularly limited as long as it is thermally decomposed to generate radicals to promote polymerization of the resin into a cured product. Any azo compounds and organic peroxides may be used as the initiator.

Suitable azo compounds or organic azo compounds include azonitrile compounds such as V-30, V-40, V-59, V-60, V-65, V-70, V-501, and V-601; azoamide compounds such as VA-080, VA-085, VA-086, VF-096, VAm-110, and VAm-111; cyclic azoamidine compounds such as VA-044 and VA-061; and azoamidine compounds such as V-50 and VA-057, all available from Wako Pure Chemical Industries, Ltd.; 2,2-azobis(4-methoxy-2,4-dimethylvaleronitrile), 2,2-azobis(2,4-dimethylvaleronitrile), 2,2-azobis(2-methylpropionitrile), 2,2-azobis(2,4-dimethylbutyronitrile), 1,1-azobis(cyclohexane-1-carbonitrile), 1-[(1-cyano-1-methylethyl)azo]formamide, 2,2-azobis{2-methyl-N-[1,1-bis(hydroxymethyl)-2-hydroxyethyl]propionamide}, 2,2-azobis[2-methyl-N-(2-hydroxybutyl)propionamide], 2,2-azobis[N-(2-propenyl)-2-methylpropionamide], 2,2-azobis(N-butyl-2-methylpropionamide), 2,2-azobis(N-cyclohexyl-2-methylpropionamide), 2,2-azobis[2-(2-imidazolin-2-yl)propane] dihydrochloride, 2,2-azobis[2-(2-imidazolin-2-yl)propane] disulfate dihydrate, 2,2-azobis{2-[1-(2-hydroxyethyl)-2-imidazolin-2-yl]propane} dihydrochloride, 2,2-azobis[2-(2-imidazolin-2-yl)propane], 2,2-azobis(1-imino-1-pyrrolidino-2-methylpropane) dihydrochloride, 2,2-azobis(2-methylpropionamidine) dihydrochloride, 2,2-azobis[N-(2-carboxyethyl)-2-methylpropionamidine] tetrahydrate, dimethyl 2,2-azobis(2-methylpropionate), 4,4-azobis(4-cyanovaleric acid), and 2,2-azobis(2,4,4-trimethylpentane). Of these, V-30, V-40, V-59, V-60, V-65, V-70, VA-080, VA-085, VA-086, VF-096, VAm-110, and VAm-111 are preferred, with V-30, V-40, V-59, V-60, V-65, and V-70 being more preferred.

Suitable organic peroxides include ketone peroxides such as PERHEXA H; peroxyketals such as PERHEXA TMH; hydroperoxides such as PERBUTYL H-69; dialkyl peroxides such as PERCUMYL D, PERBUTYL C, PERBUTYL D, and PERBUTYL 0; diacyl peroxides such as NIPER BW; peroxyesters such as PERBUTYL Z and PERBUTYL L; and peroxy dicarbonates such as PEROYL TCP, all available from NOF Corp.; diisobutyryl peroxide, cumyl peroxyneodecanoate, di-n-propyl peroxydicarbonate, diisopropyl peroxydicarbonate, di-sec-butyl peroxydicarbonate, 1,1,3,3-tetramethylbutyl peroxyneodecanoate, di(4-t-butylcyclohexyl) peroxydicarbonate, di(2-ethylhexyl) peroxydicarbonate, t-hexyl peroxyneodecanoate, t-butyl peroxyneodecanoate, t-butyl peroxyneoheptanoate, t-hexyl peroxypivalate, t-butyl peroxypivalate, di(3,5,5-trimethylhexanoyl) peroxide, dilauroyl peroxide, 1,1,3,3-tetramethylbutyl peroxy-2-ethylhexanoate, disuccinic acid peroxide, 2,5-dimethyl-2,5-di(2-ethylhexanoylperoxy)hexane, t-hexyl peroxy-2-ethylhexanoate, di(4-methylbenzoyl) peroxide, t-butyl peroxy-2-ethylhexanoate, di(3-methylbenzoyl) peroxide, benzoyl(3-methylbenzoyl) peroxide, dibenzoyl peroxide, 1,1-di(t-butylperoxy)-2-methylcyclohexane, 1,1-di(t-hexylperoxy)-3,3,5-trimethylcyclohexane, 1,1-di(t-hexylperoxy)cyclohexane, 1,1-di(t-butylperoxy)cyclohexane, 2,2-di[4,4-di-(t-butylperoxy)cyclohexyl]propane, t-hexyl peroxy isopropyl monocarbonate, t-butyl peroxymaleate, t-butyl peroxy-3,5,5-trimethylhexanoate, t-butyl peroxylaurate, t-butylperoxy isopropyl monocarbonate, t-butylperoxy 2-ethylhexyl monocarbonate, t-hexyl peroxybenzoate, 2,5-dimethyl-2,5-di(benzoylperoxy)hexane, t-butyl peroxyacetate, 2,2-di(t-butylperoxy)butane, t-butyl peroxybenzoate, n-butyl 4,4-di-t-butylperoxyvalerate, di(2-t-butylperoxyisopropyl)benzene, dicumyl peroxide, di-t-hexyl peroxide, 2,5-dimethyl-2,5-di(t-butylperoxy)hexane, t-butylcumyl peroxide, di-t-butyl peroxide, p-methane hydroperoxide, 2,5-dimethyl-2,5-di(t-butylperoxy)hexan-3-yne, diisopropylbenzene hydroperoxide, 1,1,3,3-tetramethylbutyl hydroperoxide, cumene hydroperoxide, t-butyl hydroperoxide, 2,4-dichlorobenzoyl peroxide, o-chlorobenzoyl peroxide, p-chlorobenzoyl peroxide, tris(t-butylperoxy) triazine, 2,4,4-trimethylpentyl peroxyneodecanoate, α-cumyl peroxyneodecanoate, t-amyl peroxy-2-ethylhexanoate, t-butyl peroxyisobutyrate, di-t-butyl peroxyhexahydroterephthalate, di-t-butyl peroxytrimethyladipate, di-3-methoxybutyl peroxydicarbonate, diisopropyl peroxydicarbonate, t-butyl peroxy isopropyl carbonate, 1,6-bis(t-butylperoxycarbonyloxy)hexane, diethylene glycol bis(t-butylperoxycarbonate), and t-hexyl peroxyneodecanoate; as well as Trigonox 36-C75, Laurox, Perkadox L-W75, Perkadox CH-50L, Trigonox TMBH, Kayacumene H, Kayabutyl H-70, Perkadox BC-FF, Kayahexa AD, Perkadox 14, Kayabutyl C, Kayabutyl D, Perkadox 12-XL25, Trigonox 22-N70 (22-70E), Trigonox D-T50, Trigonox 423-C70, Kayaester CND-C70, Trigonox 23-C70, Trigonox 257-C70, Kayaester P-70, Kayaester TMPO-70, Trigonox 121, Kayaester O, Kayaester HTP-65 W, Kayaester AN, Trigonox 42, Trigonox F-C50, Kayabutyl B, Kayacarbon EH, Kayacarbon I-20, Kayacarbon BIC-75, Trigonox 117, and Kayaren 6-70, all available from Kayaku AKZO Corp.

The curing agent may be used alone or in a combination of two or more.

The amount of component (Bc) used is 0.1 to 10 parts by weight, preferably 1 to 5 parts by weight per 100 parts by weight of component (A1). With less than 0.1 part of component (Bc), cure may be insufficient. More than 10 parts of the initiator can produce excess outgassing, invite cure shrinkage, or cause the resin to have high hardness or elastic modulus beyond expectation.

Examples of the epoxy resin crosslinker (Be) is not particularly limited as long as it induces heat crosslinking reaction with the hydroxyl group in the divalent group derived from a hydroxyl-containing aromatic diamine in G', to form a cured product. Examples include bisphenol A epichlorohydrin type epoxy resins, diethylene glycol diglycidyl ether, ethylene diglycidyl ether, polyethylene glycol diglycidyl ether, propylene glycol diglycidyl ether, tripropylene glycol diglycidyl ether, 1,6-hexanediol diglycidyl ether, glycerol diglycidyl ether, glycerol triglycidyl ether, diglycidylaniline, trimethylolpropane triglycidyl ether, 1,3-bis(N,N-diglycidylaminoethyl)cyclohexane, N,N,N',N'-tetraglycidyl-m-xylenediamine, and commercial products available under trade name jER from Mitsubishi Chemical Co., Ltd., for example, which may be used alone or in a combination of two or more.

The amount of component (Be) used is 0.1 to 10 parts by weight, preferably 1 to 5 parts by weight per 100 parts by weight of component (A2). With less than 0.1 part of component (Be), cure may be insufficient. More than 10 parts of the crosslinker can produce excess outgassing, invite cure shrinkage, or cause the resin to have high hardness or elastic modulus beyond expectation.

(3) Component (C)

The solvent as component (C) is used for decreasing the viscosity of the composition in order to facilitate coating to substrates or the like and improve workability.

Exemplary solvents are organic solvents including ketone solvents such as acetone, methyl ethyl ketone, methyl isobutyl ketone, and cyclohexanone; ether solvents such as dioxane, dioxolane, tetrahydrofuran, 1,2-dimethoxyethane, bis(2-methoxyethyl) ether, 1,2-bis(2-methoxyethoxy)ethane, bis(2-(2-methoxyethoxy)ethyl)ether, and methyl tert-butyl ether; ester solvents such as butyl acetate, isobutyl acetate, amyl acetate, y-valerolactone, and CELTOL series (from Daicel Corp.) including 3-methoxy butyl acetate (MBA), ethylene glycol monobutyl ether acetate (BMGAC), diethylene glycol monoethyl ether acetate (EDGAC), diethylene glycol monobutyl ether acetate (BDGAC), cyclohexanol acetate (CHXA), dipropylene glycoldimethyl ether (DMM), dipropylene glycol methyl-n-propyl ether (DPMNP), propylene glycol monomethyl ether acetate (PG-MEA), dipropylene glycol methyl ether acetate (DPMA), 1,4-butanediol diacetate (1,4-BDDA), 1,3-butylene glycolacetate (1,3-BGDA), and 1,6-hexanediol diacetate (1,6-HDDA); and amide solvents such as dimethylformamide, dimethylacetamide, N-methylpyrrolidone, N-methylcaprolactam, and 1,3-dimethyl-2-imidazolidinone, which may be used alone or in a combination of two or more.

The solvent (C) may be used in any desired amount as long as the dissolution of the silicone-modified polyimide resin (A1) or (A2) is not impaired. The amount of the solvent (C) is typically 100 to 700 parts by weight based on the silicone-modified polyimide resin (A1) or (A2).

(4) Component (D)

An antioxidant is added as component (D) to the composition for the purpose of improving the heat resistance of a cured product thereof. The antioxidant used herein may be selected from well-known antioxidants such as phenol compound-based antioxidants, organic sulfur compound-based antioxidants, amine compound-based antioxidants, and phosphorus compound-based antioxidants.

Examples of the phenol compound-based antioxidant include 2,6-di-t-butyl-4-methylphenol, n-octadecyl-3-(3,5-di-t-butyl-4-hydroxyphenyl)propionate, 2,2'-methylene-bis (4-methyl-6-t-butylphenol), 3,9-bis[2-[3-(3-t-butyl-4-hydroxy-5-methylphenyl)propionyloxy]-1,1-dimethylethyl]-2, 4,8,10-tetraoxaspiro[5.5]undecane, 4,4'-butylidenebis(6-t-butyl-3-methylphenol), 4,4'-thiobis(6-t-butyl-3-methylphenol), tetrakis[methylene-3-(3,5-di-t-butyl-4-hydroxyphenyl)propionate]methane, 2,2-thiodiethylene bis[3-(3,5-di-t-butyl-4-hydroxyphenyl)propionate], N,N'-hexamethylenebis[3-(3,5-di-t-butyl-4-hydroxyphenyl)propionamide], isooctyl-3-(3,5-di-t-butyl-4-hydroxyphenyl)propionate, 1,3, 5-trimethyl-2,4,6-tris(3,5-di-t-butyl-4-hydroxybenzyl)benzene, 4,6-bis(dodecylthiomethyl)-o-cresol, calcium bis (ethyl 3,5-di-t-butyl-4-hydroxybenzylphosphonate), 2,4-bis [(octylthio)methyl]-o-cresol, 1,6-hexanediol-bis[3-(3,5-di-t-butyl-4-hydroxyphenyl)propionate], 2-t-butyl-6-(3-t-butyl-2-hydroxy-5-methylbenzyl)-4-methylphenyl acrylate, 2-[1-(2-hydroxy-3,5-di-t-pentylphenyl)ethyl]-4,6-di-t-pentylphenyl acrylate, 2,2'-methylenebis(4-ethyl-6-t-butylphenol), 2,6-di-t-butyl-4-ethylphenol, 1,1,3-tris(2-methyl-4-hydroxy-5-t-butylphenyl)butane, triethylene glycol bis(3-t-butyl-4-hydroxy-5-methylphenyl)propionate, tris(3,5-di-t-butyl-4-hydroxybenzyl)isocyanurate, diethyl {[3,5-bis(1,1-dimethylethyl)-4-hydroxyphenyl]methyl}phosphonate, and 2,5,7,8-tetramethyl-2-(4',8',12'-trimethyltridecyl)chroman-6-ol, and 2,4-bis(n-octylthio)-6-(4-hydroxy-3,5-di-t-butylanilino)-1,3,5-triazine.

As the phenol compound-based antioxidant, those compounds containing a phenolic hydroxyl group and at least one of phosphorus atom, sulfur atom, and amine in the molecule are also listed, though they are redundant in the following list.

Examples of the organic sulfur compound-based antioxidant include dilauryl-3,3'-thiodipropionate, dimyristyl-3,3'-thiodipropionate, distearyl-3,3'-thiodipropionate, pentaerythrityl tetrakis(3-laurylthiopropionate), ditridecyl-3,3'-thiodipropionate, 2-mercaptobenzimidazole, 4,4'-thiobis(6-t-butyl-3-methylphenol), 2,2-thiodiethylene bis[3-(3,5-di-t-butyl-4-hydroxyphenyl)propionate], 4,6-bis(dodecylthiomethyl)-o-cresol, 2,4-bis[(octylthio)methyl]-o-cresol, and 2,4-bis(n-octylthio)-6-(4-hydroxy-3,5-di-t-butylanilino)-1, 3,5-triazine.

Examples of the amine compound-based antioxidant include N,N'-diallyl-p-phenylenediamine, N,N'-di-sec-butyl-p-phenylenediamine, octylated diphenylamine, and 2,4-bis(n-octylthio)-6-(4-hydroxy-3,5-di-t-butylanilino)-1, 3,5-triazine.

Examples of the phosphorus compound-based antioxidant include tris(nonylphenyl) phosphite, triphenyl phosphite, calcium bis(ethyl 3,5-di-t-butyl-4-hydroxybenzylphosphonate), tris(2,4-di-t-butylphenyl)phosphite, and diethyl{[3,5-bis(1,1-dimethylethyl)-4-hydroxyphenyl] methyl}phosphonate.

Also, commercial antioxidants may be used. Examples thereof include ADK STAB AO-60, ADK STAB AO-50, ADK STAB AO-80, ADK STAB AO-330, ADK STAB LA-52, ADK STAB LA-57, ADK STAB LA-63P, ADK STAB LA-68, ADK STAB LA-72, ADK STAB LA-77Y, ADK STAB LA-77G, ADK STAB LA-81, ADK STAB LA-82, ADK STAB LA-87, ADK STAB LA-402AF, ADK STAB LA-502XP, and ADK STAB 2112, which are from Adeka Corp.; Irganox 1010, Irganox 1010FF, Irganox 1035, Irganox 1035FF, Irganox 1076, Irganox 1076FF, Irganox 1098, Irganox 1135, Irganox 1330, Irganox 1726, Irganox 1425WL, Irganox 1520L, Irganox 245, Irganox 245FF, Irganox 259, Irganox 3114, Irganox 5057, Irganox 565, and Irgafos 168, which are from BASF Japan; SUMILIZER GA-80, SUMILIZER MDP-S, SUMILIZER WX-R, SUMILIZER, WX-RC, and SUMILIZER TP-D, which are from Sumitomo Chemical Co., Ltd.; and Sumilizer BBM-S from Sumika Chemtex Co., Ltd.

The foregoing antioxidants may be used alone or in a combination of two or more.

The amount of component (D) used is 0.01 to 1 part by weight per 100 parts by weight of the silicone-modified polyimide resin (A1) or (A2). Less than 0.01 part of component (D) is insufficient to improve heat resistance whereas more than 1 part increases outgassing at high temperature.

(5) Component (E)

Component (E) is hydrophobic fumed silica. It is an optional component which is added for the purposes of preventing fluid sagging, entrainment of bubbles during coating, and uneven coating, maintaining the composition moldable, imparting thixotropy, reducing the modulus of elasticity of cured products, and so forth.

The fumed silica preferably has a bulk density of less than 1 g/mL, especially for preventing silica from settling down during preparation and efficiently exerting the above effects.

The fumed silica preferably has an average primary particle size of 1 to 100 nm. As long as the average primary particle size is in the range, a cured product of the silicone-modified polyimide resin composition is minimized in light scattering by fumed silica, and so the cured product does not lose transparency. It is noted that the average primary particle size may be determined as a median diameter (d50) in volume basis particle size distribution measured by a particle size analyzer using such an analytic method as laser light diffractometry.

Moreover the fumed silica preferably has a BET specific surface area of 100 to 300 $m^2/g$.

The hydrophobic fumed silica as component (E) is preferably dry silica which is prepared by hydrolysis of silicon halide in an oxygen-hydrogen flame.

Commercial products may be used as the hydrophobic fumed silica. Exemplary products include hydrophobic dry silica surface-treated with hexamethyldisilazane (specific surface area 160 $m^2/g$, adsorbed carbon content 3.0 wt %, bulk density 0.14 mg/L, Nippon Aerosil Co., Ltd., trade name AEROSIL R8200), hydrophobic dry silica surface-treated with hexamethyldisilazane (specific surface area 140 m²/g, adsorbed carbon content 2.3 wt %, bulk density 0.05 g/mL, Nippon Aerosil Co., Ltd., trade name RX200), surface-treated hydrophobic dry fumed silica (specific surface area 190 m²/g, bulk density 0.05 g/mL, average primary particle size 15 nm, Tokuyama Corp., trade name REOLOSIL DM-10), surface-treated hydrophobic dry fumed silica (specific surface area 230 m²/g, bulk density 0.05 g/mL, average primary particle size 7 nm, Tokuyama Corp., trade name REOLOSIL DM-30), surface-treated hydrophobic dry fumed silica (specific surface area 230 m²/g, bulk density 0.05 g/mL, average primary particle size 7 nm, Tokuyama Corp., trade name REOLOSIL DM-30S), surface-treated hydrophobic dry fumed silica (specific surface area 230 m²/g, bulk density 0.05 g/mL, average primary particle size 7 nm, Tokuyama Corp., trade name REOLOSIL DM-30S), trade name REOLOSIL HM20S (Tokuyama Corp., average primary particle size 12 nm), trade name REOLOSIL HM30S (Tokuyama Corp., average primary particle size 7 nm), trade name REOLOSIL HM40S (Tokuyama Corp., average primary particle size 7 nm), and trade name REOLOSIL ZD30S (Tokuyama Corp., average primary particle size 7 nm).

Component (E) is preferably added in an amount of 3 to 50 parts by weight, more preferably 3 to 30 parts by weight, even more preferably 3 to 20 parts by weight per 100 parts by weight of component (A). Within this range, the composition has thickening, thixotropy, and flow properties and remains effectively workable.

By adjusting the amount of hydrophobic fumed silica added, the silicone-modified polyimide resin composition used herein can be controlled to an adequate viscosity for a particular coating method.

For example, in the case of coating by a dispenser or dipping, a viscosity of about 500 to about 10,000 mPa s at 25° C. is preferable. In the case of screen printing, a viscosity of 10,000 to 100,000 mPa s at 25° C. is preferable because of the unlikelihood of sagging.

The viscosity is not limited to the above range because an effective viscosity varies with an applicator or the like.

The silicone-modified polyimide resin composition used herein may be prepared, for example, by dissolving the silicone-modified polyimide resin (A) and antioxidant (D) in the solvent (C) to form a silicone-modified polyimide resin solution, adding the hydrophobic fumed silica (E) to the solution, stirring and mixing until uniform dispersion, and mixing the heat decomposable radical initiator (Bc) or epoxy resin crosslinker (Be) therewith.

The silicone-modified polyimide resin composition can be utilized as electronic material and optical material and in semiconductor devices for use in automobile on-board equipment. In particular, the composition is best suited for semiconductor devices which must be kept highly reliable and heat resistant by encapsulating with epoxy resins, especially power modules.

In the method of manufacturing the power module of the invention, a base member is first furnished by die bonding thereto a power semiconductor device with a die attachment material such as solder, and wire bonding with aluminum wire or the like if necessary. Then the primer in the form of the silicone-modified polyimide resin composition is applied to the base member and heat cured thereto. Although the curing conditions are not particularly limited, the curing temperature is preferably 40 to 200° C., more preferably 50 to 150° C. and the curing time is preferably 1 to 180 minutes, more preferably 10 to 120 minutes.

Subsequently, an encapsulant resin, typically epoxy resin is molded onto the surface of the silicone-modified polyimide resin coating on the base member to form an encapsulating body, completing a power module.

Depending on the design of a power module, the base member may include a surface portion where the primer is not applied. Preferably the primer is applied to not only the base member surface, but also the surface of the semiconductor device and aluminum wire.

EXAMPLES

Synthesis Examples, Preparation Examples, Examples and Comparative Examples are given below for further illustrating the invention although the invention is not limited thereto.

In Examples, the molecular weight was measured versus polystyrene standards by a GPC instrument HLC-8320GPC (Tosoh Corp.) using tetrahydrofuran (THF) as mobile phase. For infrared absorption spectroscopy (IR) analysis, Nicolet 6700 (Thermo Fisher Scientific Inc.) was used. The glass transition temperature (Tg) was measured by DMS7100 (Hitachi High-Tech Science Corp.) and defined as a temperature corresponding to the maximum of tan δ. The viscosity at 25° C. was measured by a rotational viscometer.

In Examples, all parts are by weight.

The cured products of silicone-modified polyimide resin compositions were evaluated for adhesion, storage elastic modulus by the following methods.

(1) Adhesion

The silicone-modified polyimide resin composition was applied onto a glass plate (Matsunami Glass Ind., Ltd.) and consecutively heat cured at 50° C. for 30 minutes, at 100° C. for 50 minutes, and at 150° C. for 120 minutes, yielding a cured film.

The cured film was evaluated for adhesion by the cross-cut peeling test (JIS K5400). The result is expressed as the number X of unpeeled sections per 100 cross-cut sections (X/100).

(2) Storage elastic modulus

The silicone-modified polyimide resin composition was applied onto an iron plate having a fluorochemical coating and consecutively heat cured at 50° C. for 30 minutes, at 100° C. for 60 minutes, and at 150° C. for 120 minutes, yielding a sheet of 0.3 mm thick. The sheet was measured for storage elastic modulus by DMS7100 (Hitachi High-Tech Science Corp.).

[1] Synthesis of silicone-modified polyimide resin

Synthesis Example 1

A reactor equipped with a stirring impeller, thermometer, and nitrogen inlet tube was charged with 44.4 g (0.1 mole) of 2,2-bis(3,4-anhydrodicarboxyphenyl)hexafluoropropane, 12.3 g (0.03 mole) of 4,4'-(4,4'-isopropylidenediphenyl-1,1'-diyldioxy)dianiline (i.e., 2,2-bis[4-(4-aminophenoxy)phenyl]propane), 1.48 g (0.01 mole) of phthalic anhydride, and 336 g of cyclohexanone, which were stirred at 25° C. for 2 hours. Then 112.0 g (0.07 mole) of a diamino-modified silicone of formula (i) was added dropwise at 25° C. to the reactor. After the addition, stirring was continued at 25° C. for 12 hours. Then 37 g of toluene was added to the reactor, from which water was azeotroped off at 145° C. The reaction solution was added dropwise to methanol for reprecipitation, yielding a silicone-modified polyimide resin having a siloxane content of 66% by weight.

The resin had a weight average molecular weight (Mw) of 27,000 as measured by GPC. FIG. 1 shows the IR spectrum of the resin. As seen from FIG. 1, no absorption peaks assigned to unreacted polyamic acid were observed in the spectrum, but the absorption peaks assigned to an imide group were observed at 1,780 cm$^{-1}$ and 1,720 cm$^{-1}$.

[Chem. 11]

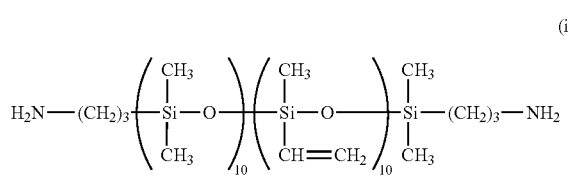

(i)

Herein the siloxane units in parentheses are randomly arranged.

Synthesis Example 2

A reactor equipped with a stirring impeller, thermometer, and nitrogen inlet tube was charged with 44.4 g (0.1 mole) of 2,2-bis(3,4-anhydrodicarboxyphenyl)hexafluoropropane, 12.3 g (0.03 mole) of 4,4'-(4,4'-isopropylidenediphenyl-1,1'-diyldioxy)dianiline [i.e., 2,2-bis[4-(4-aminophenoxy)phenyl]propane], 4.3 g (0.02 mole) of 3,3'-dihydroxybenzidine, 0.15 g (0.001 mole) of phthalic anhydride, and 229 g of cyclohexanone, which were stirred at 25° C. for 2 hours. Then 41.5 g (0.05 mole) of a diamino-modified silicone of formula (ii) was added dropwise at 25° C. to the reactor. After the addition, stirring was continued at 25° C. for 12 hours. Then 23 g of toluene was added to the reactor, from which water was azeotroped off at 145° C. The reaction solution was added dropwise to methanol for reprecipitation, yielding a silicone-modified polyimide resin having a siloxane content of 45% by weight.

Figure 2:
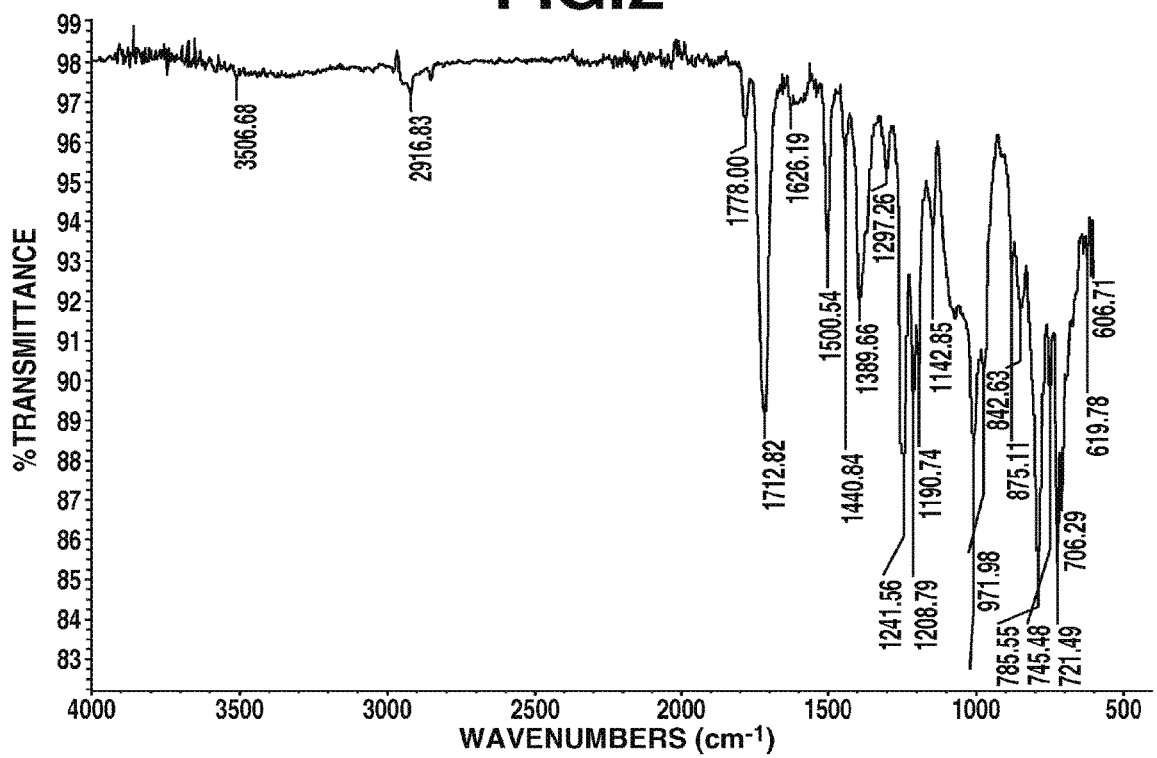
FIG. 2 is a diagram of the infrared absorption spectrum of the silicone-modified polyimide resin obtained in Synthesis Example 2.

The resin had a Mw of 24,500 as measured by GPC. FIG. 2 shows the IR spectrum of the resin. As seen from FIG. 2, no absorption peaks assigned to unreacted polyamic acid were observed in the spectrum, but the absorption peaks assigned to an imide group were observed at 1,780 cm$^{-1}$ and 1,720 cm$^{-1}$.

[Chem. 12]

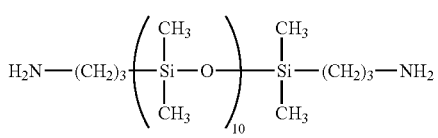

(ii)

[2] Preparation of Silicone-Modified Polyimide Resin Composition and Cured Product Preparation Example 1

A solution was prepared by adding 236 parts of propylene glycol monomethyl ether acetate (PGMEA, hereinafter) to 100 parts of the silicone-modified polyimide resin obtained in Synthesis Example 1 and stirring until dissolution. 6 parts of REOLOSIL DM-30S (Tokuyama Corp.) and 0.1 part of ADK STAB LA-77Y (Adeka Corp.) were added to the solution and stirred and then 1 part of Kayaren 6-70 (Kayaku AKZO Corp.) was added thereto. Subsequent mixing and stirring yielded a silicone-modified polyimide resin composition, which had a viscosity at 25° C. of 900 mPa·s.

A cured product of the composition showed an adhesion of 100/100 (cross-cut peeling test, film thickness 0.23 mm), a storage elastic modulus of 80 MPa, and a Tg of 111° C.

Preparation Example 2

A solution was prepared by adding 236 parts of PGMEA to 100 parts of the silicone-modified polyimide resin obtained in Synthesis Example 2 and stirring until dissolution. 6 parts of REOLOSIL DM-30S (Tokuyama Corp.) and 0.1 part of ADK STAB LA-77Y (Adeka Corp.) were added to the solution and stirred and then 5 parts of jER 630LSD (Mitsubishi Chemical Corp.) was added thereto. Subsequent mixing and stirring yielded a silicone-modified polyimide resin composition, which had a viscosity at 25° C. of 3,000 mPa·s.

A cured product of the composition showed an adhesion of 100/100 (cross-cut peeling test, film thickness 0.08 mm), a storage elastic modulus of 270 MPa, and a Tg of 168° C.

[3] Fabrication of Power Module

Example 1

A base member was furnished by die bonding a Schottky barrier diode (SBD) chip to a nickel-plated leadframe of TO-247 type via solder, and bonding aluminum wires to the chip.

Then a primer in the form of the silicone-modified polyimide resin composition obtained in Preparation Example 1 was applied to the base member, SBC chip, aluminum wires and second bond and consecutively heat cured at 50° C. for 30 minutes, at 100° C. for 50 minutes and at 150° C. for 120 minutes to form a primer layer.

Subsequently, an epoxy resin encapsulant (CV8540 by Panasonic Corp.) was transfer molded over the surface of the primer layer under conditions: 175° C., 90 seconds, 9 MPa, and 1.5 mm thickness, by G-Line press (Apic Yamada Corp.) to fabricate a power module.

Example 2

A power module was fabricated by the same procedure as in Example 1 aside from changing the resin composition to the silicone-modified polyimide resin composition obtained in Preparation Example 2.

Comparative Example 1

A power module was fabricated by the same procedure as in Example 1 aside from omitting the silicone-modified polyimide resin composition.

[Moisture Reflow Test]

The power modules fabricated in Examples and Comparative Example were subjected to the moisture reflow test according to Level 1 of Moisture Sensitivity Level of the Joint Electron Device Engineering Council (JEDEC).

The test included a series of steps of holding at 125° C. for 24 hours, moisture absorption at temperature 85° C. and humidity 85% for 168 hours, and three times of solder reflow (260° C., 3 minutes) in the duration from 15 minutes to 4 hours.

The power modules before and after the test were evaluated by ultrasonic imaging instrument (Hitachi Power Solutions Co., Ltd.) and rated "O" (passed) for no delamination and "X" (failed) for delamination observed. The results are shown in Table 1.

[Heat Resistance Test]

The power modules fabricated in Examples and Comparative Example were subjected to the heat resistance test at 175° C. for 500 hours.

The power modules before and after the test were evaluated by ultrasonic imaging instrument (Hitachi Power Solutions Co., Ltd.) and rated "○" (passed) for no delamination and "X" (failed) for delamination observed. The results are also shown in Table 1.

TABLE 1

|  | Example 1 | Example 2 | Comparative Example 1 |
|---|---|---|---|
| Moisture reflow test (MSL-1) | ○ | ○ | X |
| Heat resistance test (175° C./500 h) | ○ | ○ | X |

As seen from Table 1, the power modules of Examples 1 and 2 are devoid of delamination of epoxy resin encapsulant after the tests, indicating durability at high temperature.

The invention claimed is:

1. A power module comprising a base member having a power semiconductor device joined thereto and an encapsulating body for encapsulating the base member, wherein the encapsulating bud is bonded to the base member via a primer layer comprising a cured product of a silicone-modified polyimide resin composition, wherein said silicone-modified polyimide resin composition comprises:
(A1) 100 parts by weight of a radically crosslinking silicone-modified polyimide resin having the following formula (1):

wherein E, F and G are repeating units which are randomly arranged, E is a divalent group derived from a diamino-modified silicone, represented by the formula (2), F is a divalent group derived from a tetracarboxylic dianhydride, represented by the formula (3), and G is a divalent group derived from a diamine, with the proviso that f+e+g=100 mol %, a molar ratio of f/(e+g) is from 0.9/1 to 1.1/1, and e is 1 to 90 when the sum of e+g is 100,

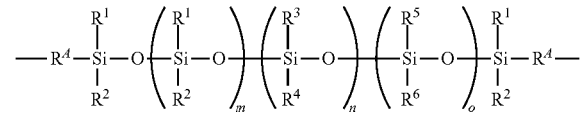

wherein $R^A$ is each independently a $C_1$-$C_{10}$ substituted or unsubstituted divalent hydrocarbon group, $R^1$ and $R^2$ are each independently a $C_1$-$C_{10}$ substituted or unsubstituted alkyl group, $R^3$ and $R^4$ are each independently a $C_1$-$C_{10}$ monovalent aliphatic hydrocarbon group, at least one of $R^3$ and $R^4$ has an aliphatic unsaturated bond, $R^5$ and $R^6$ are each independently a substituted or unsubstituted $C_1$-$C_{10}$ alkyl group, $C_6$-$C_{10}$ group or $C_7$-$C_{16}$ aralkyl group, m is an integer of 0 to 20, n is an integer of 1 to 20, o is an integer of 0 to 20, the sum of m+n+o is 1 to 30, and the arrangement of siloxane units in parentheses with subscripts m, n, and o may be random, alternate or blockwise,

wherein Im is a cyclic group terminated with a cyclic imide structure, and X is a $C_7$-$C_{12}$ arylenealkylene group, (Bc) 0.1 to 10 parts by weight of a heat decomposable radical initiator, (C) 100 to 700 parts by weight of a solvent, (D) 0.01 to 1 part by weight of an antioxidant, and (E) 3 to 50 parts by weight of hydrophobic fumed silica.

2. The power module of claim 1, wherein Im is selected from the following groups:

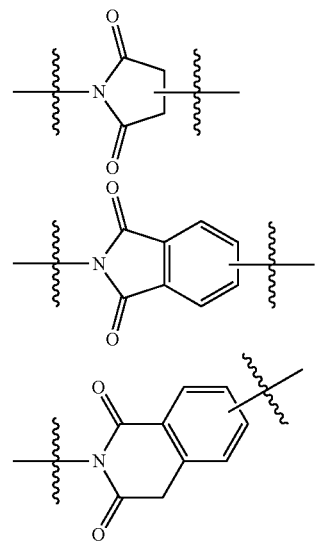

wherein the line with an intersecting wavy line designates a valence bond and the valence bond of the nitrogen atom attaches to E or G in formula (2) or to E' or G' in formula (2') and the other valence bond attaches to X.

3. A power module comprising a base member having a power semiconductor device joined thereto and an encapsulating body for encapsulating the base member, wherein the encapsulating body is bonded to the base member via a primer layer comprising a cured product of a silicone-modified polyimide resin composition, wherein said silicone-modified polyimide resin composition comprises:
(A2) 100 parts by weight of an epoxy curable silicone-modified polyimide resin having the following formula (1'):

wherein E', F' and Ci' are repeating units which are randomly arranged, E' is a divalent group derived from a diamino-modified silicone, represented by the formula (2'), F' is a divalent group derived from a tetracarboxylic dianhydride, represented by the formula (3), (G' is a divalent group derived from a diamine, and at least some of G' contain a divalent group derived from a hydroxyl-containing aromatic diamine, with the proviso that f'+e'+g'=100 mol %, a molar ratio of f'/(e'+g') is from 0.9/1 to 1.1/1, and e' is 1 to 90 when the sum of e'+g' is 100,

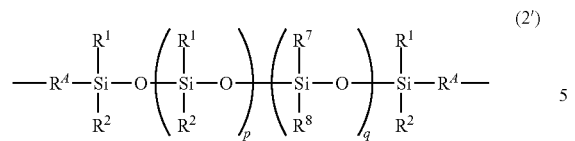
(2')

wherein $R^A$ is each independently a $C_1$-$C_{10}$ substituted or unsubstituted divalent hydrocarbon group, $R^1$ and $R^2$ are each independently a $C_1$-$C_{10}$ substituted or unsubstituted alkyl group, $R^7$ and $R^8$ are each independently a substituted or unsubstituted $C_6$-$C_{10}$ aryl group or $C_7$-$C_{16}$ aralkyl group, p is an integer of 1 to 20, q is an integer of 0 to 20, the sum of p+q is 1 to 30, and the arrangement of siloxane units in parentheses with subscripts p and q may be random, alternate or blockwise, -Im-X-Im- (3)

wherein Im is a cyclic group terminated with a cyclic imide structure, and X is a $C_7$-$C_{12}$ arylenealkylene group,
 (Be) 0.1 to 10 parts by weight of an epoxy resin crosslinker,
 (C) 250 to 1,200 parts by weight of a solvent,
 (D) 0.01 to 1 part by weight of an antioxidant, and
 (E) 3 to 50 parts by weight of hydrophobic fumed silica.

* * * * *